US012658777B2

(12) United States Patent
Undre et al.

(10) Patent No.: US 12,658,777 B2
(45) Date of Patent: Jun. 16, 2026

(54) SYSTEMS AND METHODS FOR POWER SWITCH CONTROL FOR INVERTER FOR ELECTRIC VEHICLE

(71) Applicant: BorgWarner US Technologies LLC, Wilmington, DE (US)

(72) Inventors: Vishal Shivaji Undre, Nuremberg (DE); Chetan Ugare, Nuremberg (DE); Andreas Apelsmeier, Pollenfeld (DE)

(73) Assignee: BorgWarner US Technologies LLC, Wilmington, DE (US)

( * ) Notice: Subject to any disclaimer, the term of this patent is extended or adjusted under 35 U.S.C. 154(b) by 332 days.

(21) Appl. No.: 18/543,071

(22) Filed: Dec. 18, 2023

(65) Prior Publication Data

US 2025/0202340 A1     Jun. 19, 2025

(51) Int. Cl.
    *H02M 1/08* (2006.01)
    *H02M 1/00* (2006.01)
    *H03K 17/041* (2006.01)
    *H03K 17/12* (2006.01)

(52) U.S. Cl.
    CPC ........... *H02M 1/0029* (2021.05); *H02M 1/08* (2013.01); *H03K 17/04106* (2013.01); *H03K 17/122* (2013.01); *H02M 1/0054* (2021.05)

(58) Field of Classification Search
    CPC .... H02M 1/08; H02M 1/0029; H02M 1/0054; H02M 1/0006; H03K 17/04106; H03K 17/122
    See application file for complete search history.

(56) References Cited

U.S. PATENT DOCUMENTS

| | | | |
|---|---|---|---|
| 11,277,127 | B1 | 3/2022 | Mantooth et al. |
| 2017/0274776 | A1 | 9/2017 | Xu et al. |
| 2017/0288597 | A1* | 10/2017 | Ojima ................ H03K 17/0406 |
| 2018/0062633 | A1* | 3/2018 | Nomura ................. H02M 1/08 |
| 2019/0028096 | A1 | 1/2019 | Lee |
| 2020/0350813 | A1* | 11/2020 | Ujita ....................... H02M 1/08 |
| 2022/0109438 | A1 | 4/2022 | Nakamura |

(Continued)

OTHER PUBLICATIONS

H. C. P. Dymond, D. Liu, J. Wang, J. J. O. Dalton and B. H. Stark, "Multi-level active gate driver for SiC MOSFETs," 2017 IEEE Energy Conversion Congress and Exposition (ECCE), Cincinnati, OH, USA, 2017, pp. 5107-5112, doi: 10.1109/ECCE.2017. 8096860.

(Continued)

*Primary Examiner* — Alex Torres-Rivera

(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a power switch including a gate terminal; and a gate driver configured to: receive a pulse to control an operation of the power switch, generate, based on the received pulse, a first signal to the gate terminal to increase a gate voltage level of the power switch at a first rate from an off-state gate voltage level to a first on-state gate voltage level in a first time period, and generate, based on the received pulse, a second signal to the gate terminal to increase the gate voltage level of the power switch at a second rate, less than the first rate, to a second on-state gate voltage level in a second time period subsequent to the first time period.

17 Claims, 9 Drawing Sheets

(56)                    References Cited

U.S. PATENT DOCUMENTS

2022/0209658  A1      6/2022   Bafna
2023/0021657  A1      1/2023   Akiyama

OTHER PUBLICATIONS

L. Wang, B. J. D. Vermulst, J. L. Duarte and H. Huisman, "Thermal Stress Reduction and Lifetime Improvement of Power Switches with Dynamic Gate Driving Strategy," 2019 21st European Conference on Power Electronics and Applications (EPE '19 ECCE Europe), Genova, Italy, 2019, pp. P.1-P.8, doi: 10.23919/EPE.2019. 8915391.
Sukhatme Yash et al: "A simple reduced 1-15 order model for switching dynamics of Silicon Carbide MOSFET power module", 2018 IEEE International Conference on Power Electronics, Drives and Energy Systems (PEDES), IEEE, Dec. 18, 2018 (Dec. 18, 2018), pp. 1-5, XP033546021.

\* cited by examiner

SYSTEMS AND METHODS FOR POWER SWITCH CONTROL FOR INVERTER FOR ELECTRIC VEHICLE

TECHNICAL FIELD

Various embodiments of the present disclosure relate generally to systems and methods for one or more controllers for a power switch, and, more particularly, to systems and methods for controlling a gate driver for a power switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, switching losses of a power device switch can contribute to the inefficiencies of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a power switch including a gate terminal; and a gate driver configured to: receive a pulse to control an operation of the power switch, generate, based on the received pulse, a first signal to the gate terminal to increase a gate voltage level of the power switch at a first rate from an off-state gate voltage level to a first on-state gate voltage level in a first time period, and generate, based on the received pulse, a second signal to the gate terminal to increase the gate voltage level of the power switch at a second rate, less than the first rate, to a second on-state gate voltage level in a second time period subsequent to the first time period.

In some aspects, the techniques described herein relate to a system, wherein the first rate is configured to cause the power switch to transition from the off-state gate voltage level to the first on-state gate voltage level in less than 1 μs.

In some aspects, the techniques described herein relate to a system, wherein the second time period is subsequent to a settling of a ringing phase at the gate terminal of the power switch, wherein the ringing phase is caused by the generated first signal.

In some aspects, the techniques described herein relate to a system, wherein the second rate is configured to cause the power switch to increase to the second on-state gate voltage level with reduced oscillations relative to oscillations of the gate voltage level of the power switch in the first time period.

In some aspects, the techniques described herein relate to a system, wherein the gate driver is further configured to: generate, based on the received pulse, a third signal to the gate terminal to decrease the gate voltage level of the power switch from the first on-state gate voltage level to a third on-state gate voltage level, lower than the first on-state gate voltage level, in a third time period subsequent to the first time period and preceding the second time period.

In some aspects, the techniques described herein relate to a system, wherein the second signal is configured to increase the gate voltage level of the power switch from the third on-state gate voltage level to the second on-state gate voltage level.

In some aspects, the techniques described herein relate to a system, wherein the third signal is configured to cause the power switch to decrease to the third on-state gate voltage level to avoid an overshoot of the gate voltage level of the power switch above a maximum rated gate voltage level of the power switch.

In some aspects, the techniques described herein relate to a system, wherein the gate driver is further configured to: generate, based on the received pulse, a fourth signal to the gate terminal to decrease the gate voltage level of the power switch from the second on-state gate voltage level to the off-state gate voltage level in a fourth time period subsequent to the second time period.

In some aspects, the techniques described herein relate to a system, further including: the battery configured to supply the DC power to the inverter; and the motor configured to receive the AC power from the inverter to drive the motor.

In some aspects, the techniques described herein relate to a system, further including: an electric vehicle including the battery, the inverter, and the motor.

In some aspects, the techniques described herein relate to a system including: a power switch driver configured to: receive a pulse to control an operation of a power switch, generate, based on the received pulse, a first signal to the power switch to increase a gate voltage level of the power switch at a first rate from an off-state gate voltage level to a first on-state gate voltage level in a first time period, and generate, based on the received pulse, a second signal to the power switch to increase the gate voltage level of the power switch at a second rate, less than the first rate, to a second on-state gate voltage level in a second time period subsequent to the first time period.

In some aspects, the techniques described herein relate to a system, wherein: the first rate is at least 22V/1 μs, and the second rate is approximately 3V/8 μs.

In some aspects, the techniques described herein relate to a system, wherein the power switch driver is an external waveform controller for a gate driver.

In some aspects, the techniques described herein relate to a system, wherein the power switch driver includes one or more power supplies to generate one or more of the first signal or the second signal.

In some aspects, the techniques described herein relate to a system, wherein the power switch driver includes one or more switches to generate one or more of the first signal or the second signal.

In some aspects, the techniques described herein relate to a system, wherein the power switch driver includes one or more diodes to control flow of current from an external power supply.

In some aspects, the techniques described herein relate to a system, wherein the power switch driver includes one or more resistors to control the first rate and the second rate.

In some aspects, the techniques described herein relate to a system including: a gate driver configured to receive a pulse to control an operation of a power switch, and generate a gate signal based on the pulse; and a waveform controller configured to: receive the gate signal from the gate driver, generate, based on the received gate signal, a first signal to the power switch to increase a gate voltage level of the power switch at a first rate from an off-state gate voltage level to a first on-state gate voltage level in a first time period, and generate, based on the received gate signal, a second signal to the power switch to increase the gate voltage level of the power switch at a second rate, less than the first rate, to a second on-state gate voltage level in a second time period subsequent to the first time period.

In some aspects, the techniques described herein relate to a system, wherein the waveform controller includes one or more electrical hardware components to control a time delay between an initial rise in the gate voltage level of the power switch to the first on-state gate voltage level and a subsequent rise in the gate voltage level of the power switch to the second on-state gate voltage level.

In some aspects, the techniques described herein relate to a system, wherein the waveform controller includes one or more electrical hardware components to control the second rate.

In some aspects, the techniques described herein relate to a method including performing, by one or more controllers, operations including: receiving a pulse to control an operation of a power switch including a gate terminal; generating, based on the received pulse, a first signal to the gate terminal to increase a gate voltage level of the power switch at a first rate from an off-state gate voltage level to a first on-state gate voltage level in a first time period; and generating, based on the received pulse, a second signal to the gate terminal to increase the gate voltage level of the power switch at a second rate, less than the first rate, to a second on-state gate voltage level in a second time period subsequent to the first time period.

In some aspects, the techniques described herein relate to a method, wherein the first rate is configured to cause the power switch to transition from the off-state gate voltage level to the first on-state gate voltage level in less than 1 μs.

In some aspects, the techniques described herein relate to a method, wherein the second time period is subsequent to a settling of a ringing phase at the gate terminal of the power switch, wherein the ringing phase is caused by the generated first signal.

In some aspects, the techniques described herein relate to a method, wherein the second rate is configured to cause the power switch to increase to the second on-state gate voltage level with reduced oscillations relative to oscillations of the gate voltage level of the power switch in the first time period.

In some aspects, the techniques described herein relate to a method, wherein the operations further include: generating, based on the received pulse, a third signal to the gate terminal to decrease the gate voltage level of the power switch from the first on-state gate voltage level to a third on-state gate voltage level, lower than the first on-state gate voltage level, in a third time period subsequent to the first time period and preceding the second time period.

In some aspects, the techniques described herein relate to a method, wherein the second signal is configured to increase the gate voltage level of the power switch from the third on-state gate voltage level to the second on-state gate voltage level.

In some aspects, the techniques described herein relate to a method, wherein the third signal is configured to cause the power switch to decrease to the third on-state gate voltage level to avoid an overshoot of the gate voltage level of the power switch above a maximum rated gate voltage level of the power switch.

In some aspects, the techniques described herein relate to a method, wherein the operations further include: generating, based on the received pulse, a fourth signal to the gate terminal to decrease the gate voltage level of the power switch from the second on-state gate voltage level to the off-state gate voltage level in a fourth time period subsequent to the second time period.

In some aspects, the techniques described herein relate to a method, further including: receiving DC power from a battery; converting the DC power to AC power using the operation of the power switch; and providing the AC power to a motor.

In some aspects, the techniques described herein relate to a method, wherein: the one or more controllers, the power switch, the battery, and the motor are provided as a system in an electric vehicle.

In some aspects, the techniques described herein relate to a method including performing, by one or more controllers, operations including: receiving a pulse to control an operation of a power switch; generating, based on the received pulse, a first signal to the power switch to increase a gate voltage level of the power switch at a first rate from an off-state gate voltage level to a first on-state gate voltage level in a first time period, and generating, based on the received pulse, a second signal to the power switch to increase the gate voltage level of the power switch at a second rate, less than the first rate, to a second on-state gate voltage level in a second time period subsequent to the first time period.

In some aspects, the techniques described herein relate to a method, wherein: the first rate is configured to cause the power switch to transition from the off-state gate voltage level to the first on-state gate voltage level in less than 1 μs, and the second rate is configured to cause the power switch to increase to the second on-state gate voltage level with reduced oscillations relative to oscillations of the gate voltage level of the power switch in the first time period.

In some aspects, the techniques described herein relate to a method, wherein the second time period is subsequent to a settled ringing phase of the power switch, wherein the ringing phase is caused by the generated first signal.

In some aspects, the techniques described herein relate to a method, wherein the operations further include: generating, based on the received pulse, a third signal to the power switch to decrease the gate voltage level of the power switch from the first on-state gate voltage level to a third on-state gate voltage level, lower than the first on-state gate voltage level, in a third time period subsequent to the first time period and preceding the second time period.

In some aspects, the techniques described herein relate to a method, wherein the second signal is configured to increase the gate voltage level of the power switch from the third on-state gate voltage level to the second on-state gate voltage level.

In some aspects, the techniques described herein relate to a method, wherein the third signal is configured to cause the power switch to decrease to the third on-state gate voltage level to avoid an overshoot of the gate voltage level of the power switch above a maximum rated gate voltage level of the power switch.

In some aspects, the techniques described herein relate to a method, wherein the operations further include: generating, based on the received pulse, a fourth signal to the power switch to decrease the gate voltage level of the power switch from the second on-state gate voltage level to the off-state gate voltage level in a fourth time period subsequent to the second time period.

In some aspects, the techniques described herein relate to a method including performing, by one or more controllers, operations including: receiving a pulse to control an operation of a power switch; generating a gate signal based on the pulse; generating, based on the received gate signal, a first signal to the power switch to increase a gate voltage level of the power switch at a first rate from an off-state gate voltage level to a first on-state gate voltage level in a first time period; and generating, based on the received gate signal, a second signal to the power switch to increase the gate voltage level of the power switch at a second rate, less than the first rate, to a second on-state gate voltage level in a second time period subsequent to the first time period.

In some aspects, the techniques described herein relate to a method, wherein: the first rate is configured to cause the power switch to transition from the off-state gate voltage level to the first on-state gate voltage level in less than 1 µs, and the second rate is configured to cause the power switch to increase to the second on-state gate voltage level with reduced oscillations relative to oscillations of the gate voltage level of the power switch in the first time period.

In some aspects, the techniques described herein relate to a method, wherein the operations further include: generating, based on the received gate signal, a third signal to the power switch to decrease the gate voltage level of the power switch from the first on-state gate voltage level to a third on-state gate voltage level, lower than the first on-state gate voltage level, in a third time period subsequent to the first time period and preceding the second time period.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
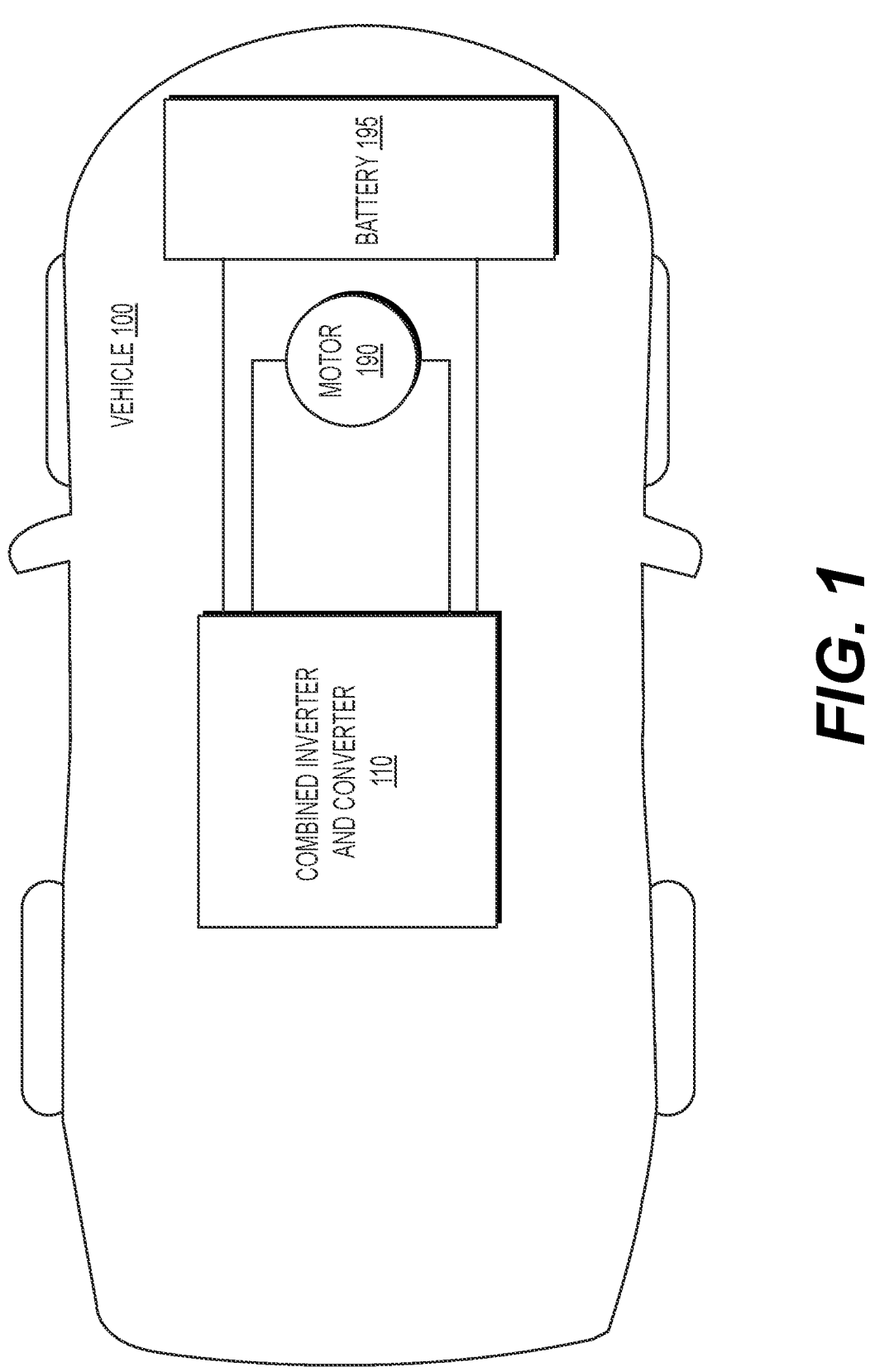
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for one or more controllers for a power switch, and, more particularly, to systems and methods for controlling a gate driver for a power switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switch groups, (e.g. six power switches) to control the phase voltage, upper and lower gate drivers to control the switches, and a PWM controller to control the gate drivers. The PWM controller may generate signals to define the intended states of the system. The gate drivers may send the amplified signals from the PWM controller to the phase switches. The phase switches may drive the phase voltage.

In a traction inverter, a power module may be an important component of the overall system, and an efficiency of the system may be directly proportional to losses occurring in the power module. Addressing switching losses and conduction losses of the power module may be necessary for an efficient, cost-effective, and robust inverter design. One or more embodiments may reduce switching and conduction losses.

In some solutions, a gate of a MOSFET is turned on with a fixed gate voltage. Therefore, the gate sourcing current is limited by gate resistance only. A fixed gate voltage does not allow a reduction of an on-state resistance of the MOSFET. Some solutions address this limitation by using a current-controlled gate driver to control the gate sourcing current of the MOSFET. Some solutions use a gate voltage margin to maximum limit (Vgs max) based on oscillations and dynamic behavior. Some solutions use a variable gate resistor to vary the gate sourcing current.

A power switch may be controlled by gate-to-source voltage (Vgs). For example, a negative Vgs may transition the power switch to an off, or open, state, and a positive Vgs may transition the power switch to an on, or closed, state. The positive, or turn-on, Vgs is limited to a value below a maximum positive Vgs for the power switch to maintain dynamic voltages within a safety margin for the power switch to avoid failure of the power switch. Similarly, the negative, or turn-off, Vgs is limited to a value above a maximum negative Vgs for the power switch. For example, a power switch having a maximum rating from −8V to 19V may have a turn-off Vgs of −4V and a turn-on Vgs of 15V.

Switching losses in the power switch are dependent on a switching speed of the power switch, such as a loss in a turn-on transition of the power switch. Turning the power switch on more quickly will decrease this turn-on loss.

One or more embodiments may include a system to turn on a power switch with an initial Vgs having a first value, reduce the Vgs from the first value to a second value in a ringing phase, and increase the Vgs from the second value to a third value after the ringing phase. For example, for a power switch having a maximum range from −8V to 19V, the first value for the Vgs may be 18V, the second value may be 15V, and the third value may be 18V. The initial Vgs may quickly, at a first rate, transition the power switch from an off state to an on state, which, if not mitigated, may introduce excessive oscillations, or ringing, in the power switch. For example, if the 18V initial Vgs is maintained during the ringing phase, the power switch may overshoot a maximum current rating of the switch, which may damage the power switch.

Accordingly, one or more embodiments may reduce the initial Vgs (e.g. 18V) to a second value (e.g. 15V) during the ringing phase of the power switch subsequent to the initial turn-on. Reducing the initial Vgs to the second value may avoid exceeding a rated gate voltage of the power switch during the ringing phase. A voltage level at the output of gate driver may be higher than a MOSFET gate voltage capability. Accordingly, a gate voltage may be reduced due to a static gate voltage limit and to avoid exceeding the limit during ringing. However, the reduced Vgs also increases the on-state resistance of the power switch, which may increase a junction temperature of the power switch and/or increase a conduction loss of the power switch.

Accordingly, one or more embodiments may slowly increase, at a second rate less than the first rate, the Vgs to a third value (e.g. 18V) higher than the second value (e.g. 15V). The slow increase to the third value may limit dynamics in the complete inverter/converter system. The increased Vgs may reduce the on-state resistance of the power switch, which may decrease (or avoid an increase in) a junction temperature of the power switch and/or decrease a conduction loss of the power switch.

The first value may be less than, the same as, or greater than a maximum Vgs of the power switch. The second value may be less than the first value. The third value may be greater than the second value, and may be less than, the same as, or greater than the first value.

One or more embodiments may decrease a switching loss of the power switch with a first high Vgs. One or more embodiments may avoid exceeding a rated gate voltage during a ringing phase of the power switch with a second lower Vgs. A voltage level at the output of gate driver may be higher than a MOSFET gate voltage capability. Accordingly, a gate voltage may be reduced due to a static gate voltage limit and to avoid exceeding the limit during ringing. One or more embodiments may decrease a conduction loss of the power switch with a third higher Vgs. One or more embodiments may limit dynamics, such as additional ringing of the power switch, during the transition from the second lower Vgs to the third higher Vgs with a ramped Vgs.

At an initial turn-on phase, one or more embodiments may apply a higher gate voltage. The gate voltage may then be reduced to avoid exceeding a rated gate voltage. A voltage level at the output of gate driver may be higher than a MOSFET gate voltage capability. Accordingly, a gate voltage may be reduced due to a static gate voltage limit and to avoid exceeding the limit during ringing. Following a ringing phase caused by the initial turn-on phase higher gate voltage, one or more embodiments may increase the gate voltage to reduce an on-state resistance (Rds-on) of the power switch. One or more embodiments may increase the gate voltage slowly to avoid further ringing in the circuit. Due to the increased gate voltage, a conduction loss in the power switch will decrease. This decreased conduction loss may reduce a junction temperature of the power switch and may therefore reduce a thermal requirement of the substrate. One or more embodiments may provide a gate signal pattern that increases a gate voltage after ringing (following an initial turn-on of a power switch). One or more embodiments may provide a power level signal pattern for one or more Si MOSFET, SiC MOSFET, IGBT, or GaN devices, for example. A power level may refer to an output signal from a gate driver. A power level may be a gate voltage level, for example.

One or more embodiments may apply a higher gate voltage to charge the gate faster. One or more embodiments may reduce the gate voltage to avoid exceeding a rated gate voltage. A voltage level at the output of gate driver may be higher than a MOSFET gate voltage capability. Accordingly, a gate voltage may be reduced due to a static gate voltage limit and to avoid exceeding the limit during ringing. One or more embodiments may increase the gate voltage to a higher voltage to reduce on-state resistance when the ringing subsides.

One or more embodiments may provide a fast turn-on power switch without an increase in ringing. One or more embodiments may provide a reduced on-state resistance, reduced conduction loss, and reduced junction temperature. One or more embodiments may provide a reduced substrate size and reduction in a cost and overall size of the power module, due to the reduced junction temperature.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
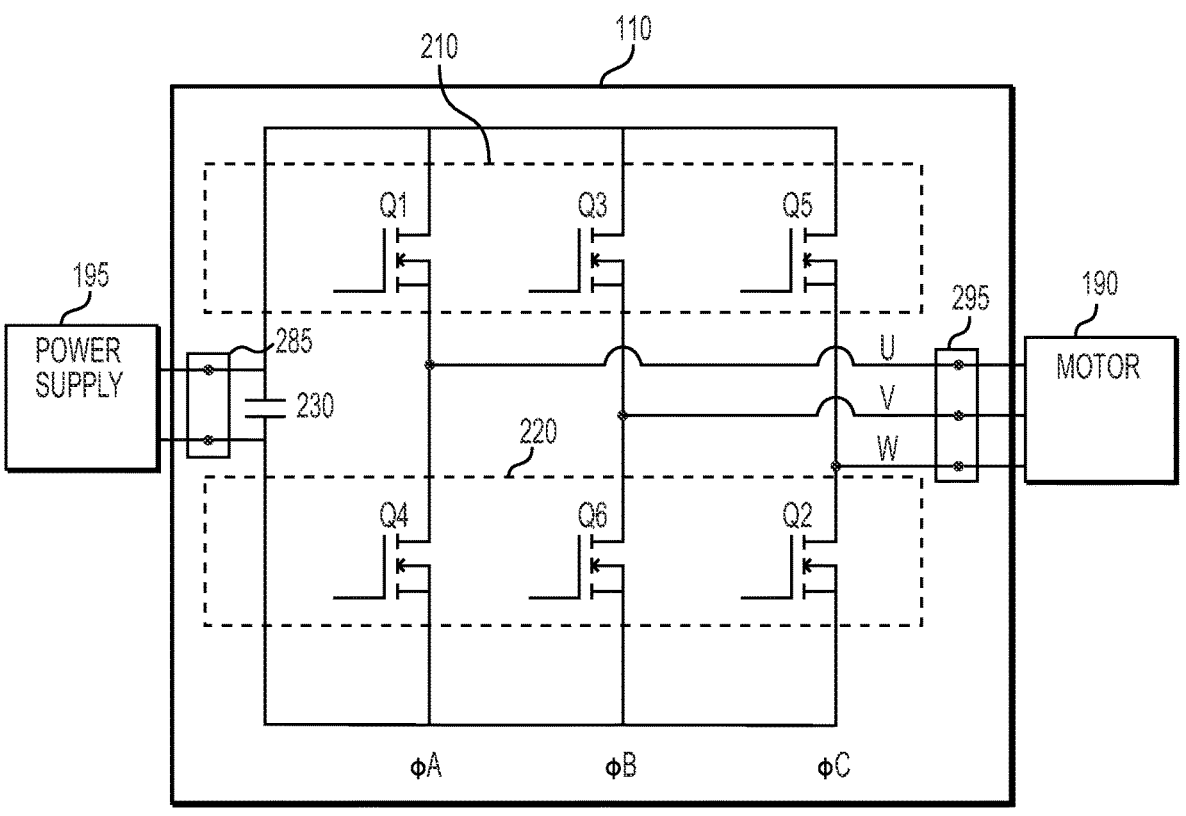
FIG. 2 depicts an electrical power schematic of a three phase inverter module in a connected system, according to one or more embodiments.

FIG. 2 depicts an electrical power schematic of a three phase inverter module, according to one or more embodiments. As shown in FIGS. 1 and 2, inverter 110 may be connected to a battery, or power supply, 195 and a motor, or load, 190. Inverter 110 may include first three-phase switch group 210, and second three-phase switch group 220. A first phase U may correlate with φA including switches Q1 and Q4, a second phase V may correlate with φB including switches Q3 and Q6, and a third phase W may correlate with φC including switches Q5 and Q2, as illustrated in FIG. 2. First three-phase switch group 210 may include first phase switch Q1, second phase switch Q3, and third phase switch Q5. Second three-phase switch group 220 may include first phase switch Q4, second phase switch Q6, and third phase switch Q2. Switches Q1-Q6 may be metal-oxide-semiconductor field-effect transistors (MOSFET), for example, but are not limited thereto.

The first three-phase switch group 210 and second three-phase switch group 220 may be driven by a PWM signal (as illustrated, for example, in FIGS. 5, 7, and 9) generated by inverter controller 300 to convert DC power delivered via input terminal set 285 at capacitor 230 to three phase AC power at outputs U, V, and W via output terminal set 295 to motor 190. Additionally, although FIGS. 1 and 2 illustrate a three-phase inverter, the disclosure is not limited thereto, and may include single phase or multi-phase inverters.

Figure 3:
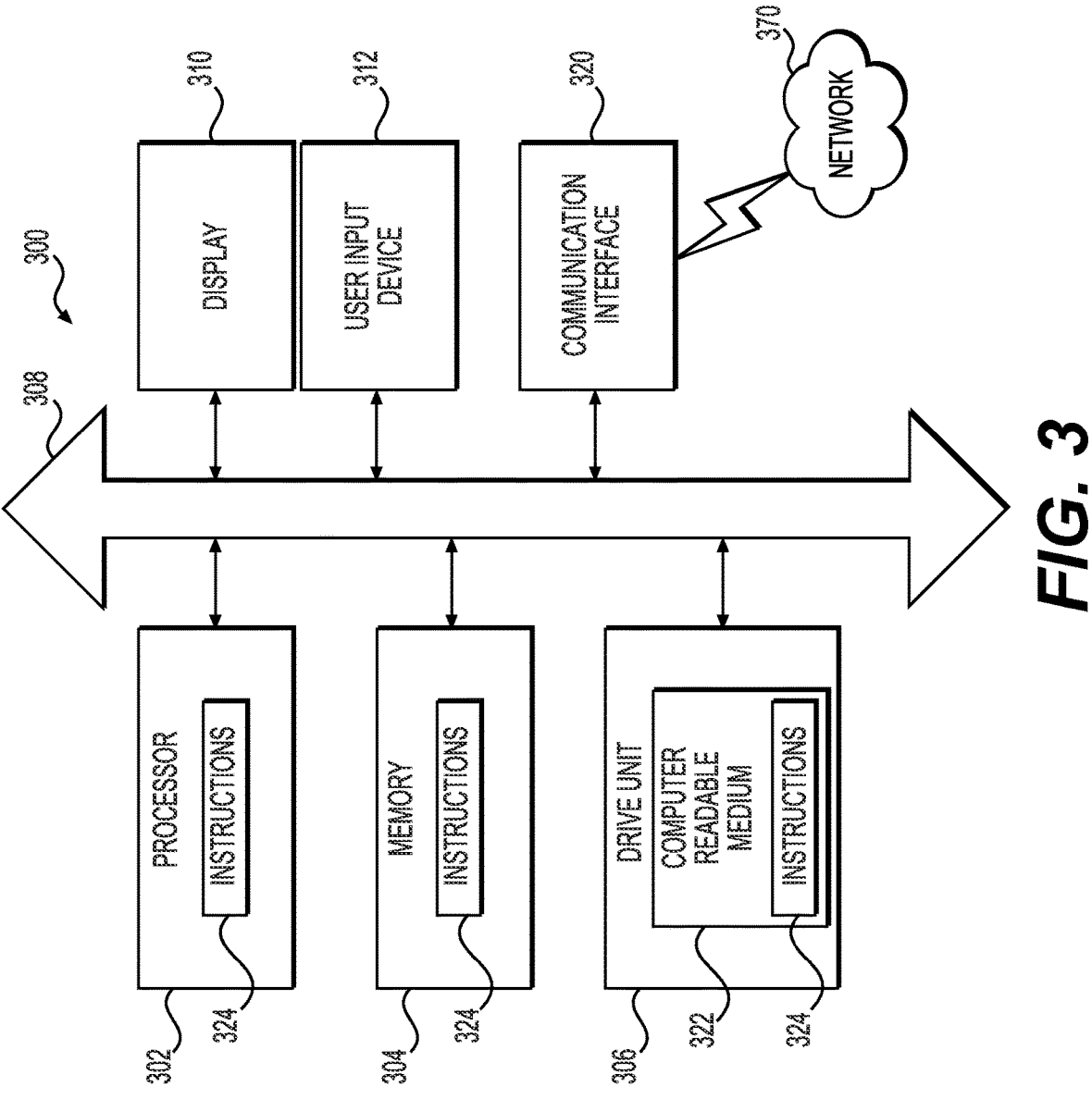
FIG. 3 depicts an implementation of a computer system that may execute techniques presented herein, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as inverter 110 in electric vehicle 100, a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370.

Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
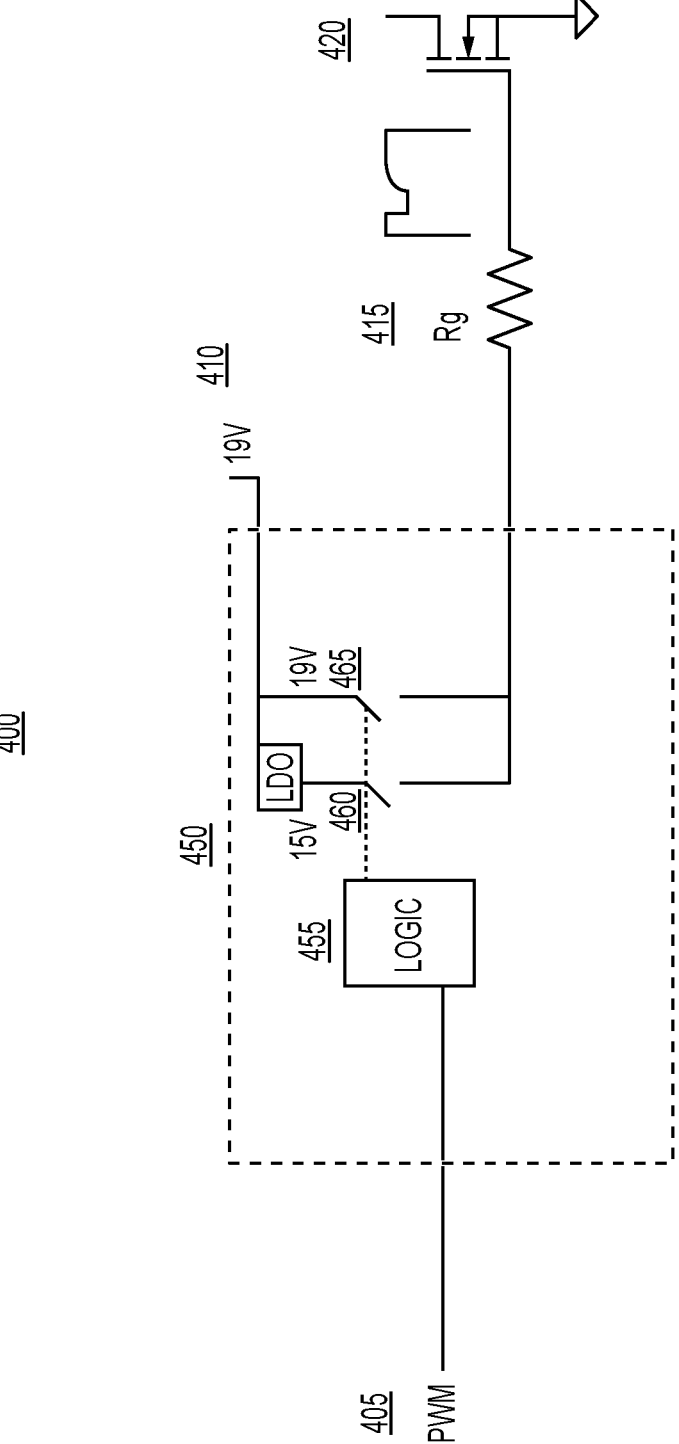
FIG. 4 depicts a power switch control system, according to one or more embodiments.

FIG. 4 depicts a power switch control system, according to one or more embodiments. As shown in FIG. 4, gate driver system 400 may include gate driver 450 and power switch 420. Gate driver 450 may receive a pulse width modulation signal as PWM signal 405 from an external source, such as inverter controller 300, for example. Gate driver 450 provide an output signal (e.g. see output signal 501 in FIG. 5) through gate resistor 415 to a gate of power switch 420 based on the PWM signal 405. Gate driver 450 may convert an input voltage 410 to the output signal using one or more of logic 455, first switch 460, or second switch 465. Logic 455 may be one or more of hardware-based logic or software-based logic. Logic 455 may receive PWM signal 405 and control an operation of one or more of first switch 460 or second switch 465 to generate the output signal as one or more of input voltage 410 or a converted voltage of input voltage 410. Gate driver system 400 may include an external waveform controller for a gate driver or an internal waveform controller in a gate driver. The input voltage 410 may be any voltage limit as per the power switch rating and is not limited to 19V. The power switch limit voltage may be split into two or more voltages and may be controlled later to set a particular conduction loss or RDsoN of the MOSFET.

Figure 5:
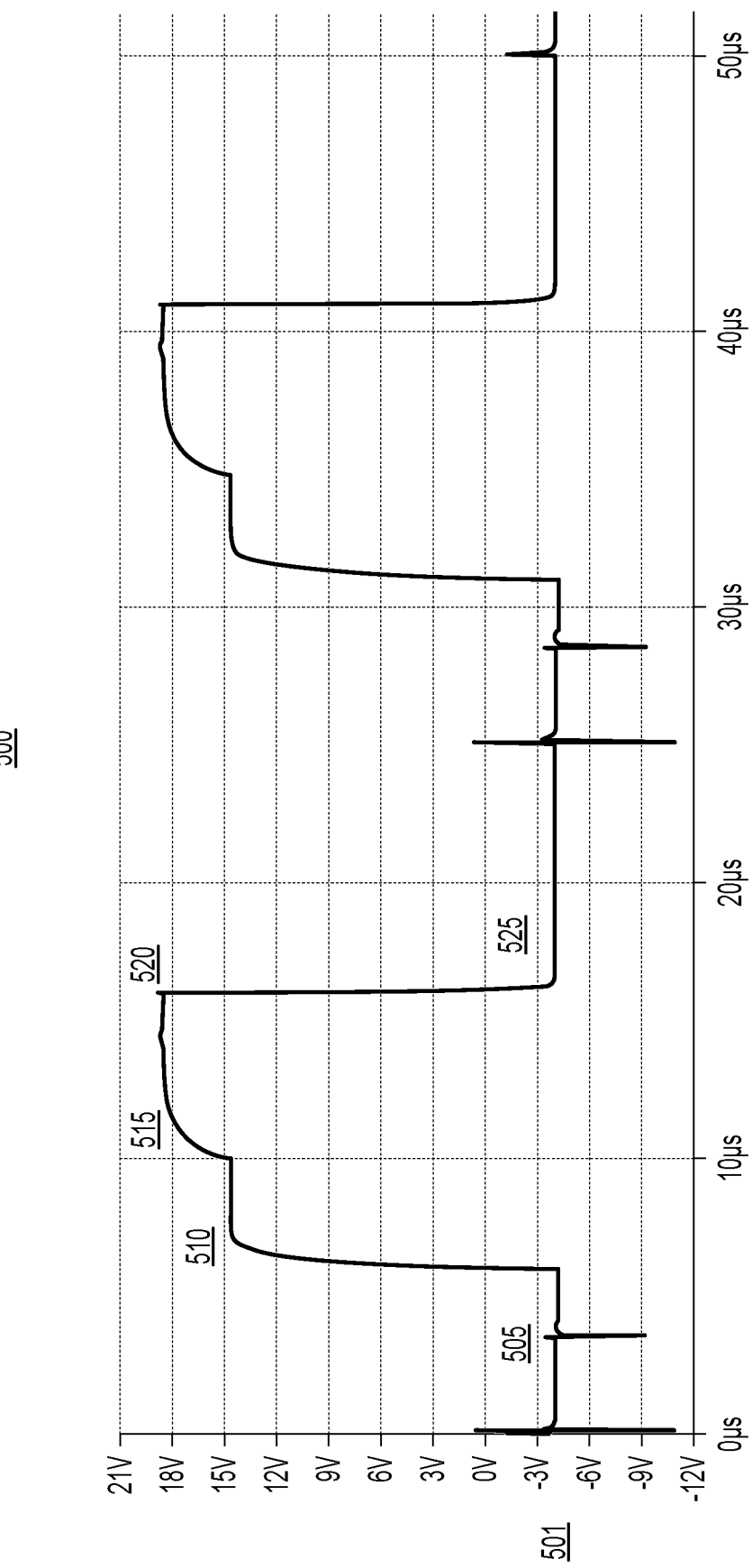
FIG. 5 depicts an output signal of a power switch control system, according to one or more embodiments.

FIG. 5 depicts an output signal of a power switch control system, according to one or more embodiments. As shown in plot 500, output signal 501 may be an output signal to a gate of a power switch, such as the output signal generated to a gate of power switch 420, for example. Output signal 501 may be signal at a gate of a power switch, which may be different from an output signal from a gate driver to the gate, for example. Output signal 501 may include a first off-state power level 505, a first on-state power level 510, a second on-state power level 515, and a turn-off signal 520 to a second off-state power level 525. A power level may refer to an output signal from a gate driver. A power level may be a gate voltage level, for example. Output signal 501 may include various signal artefacts, such as a signal spike in first off-state power level 505, for example. Output signal 501 may be periodic so that second off-state power level 525 corresponds to first off-state power level 505 with a time delay. For example, output signal 501 may have a period of approximately 25 µs. For example, output signal 501 may include a first off-state power level 505 of approximately –4V, a first on-state power level 510 of approximately 15V, a second on-state power level 515 of approximately 18V, and turn-off signal 520 from a power level of approximately 18V to a second off-state power level 525 of approximately –4V.

As shown in FIG. 5, output signal 501 may increase at a first rate from first off-state power level 505 to first on-state power level 510 to quickly transition from first off-state power level 505 to first on-state power level 510. Output signal 501 may increase at a second rate from first on-state power level 510 to second on-state power level 515 to increase to second on-state power level 515 with reduced oscillations relative to oscillations of the power level of the power switch from first off-state power level 505 to first on-state power level 510.

Figure 6:
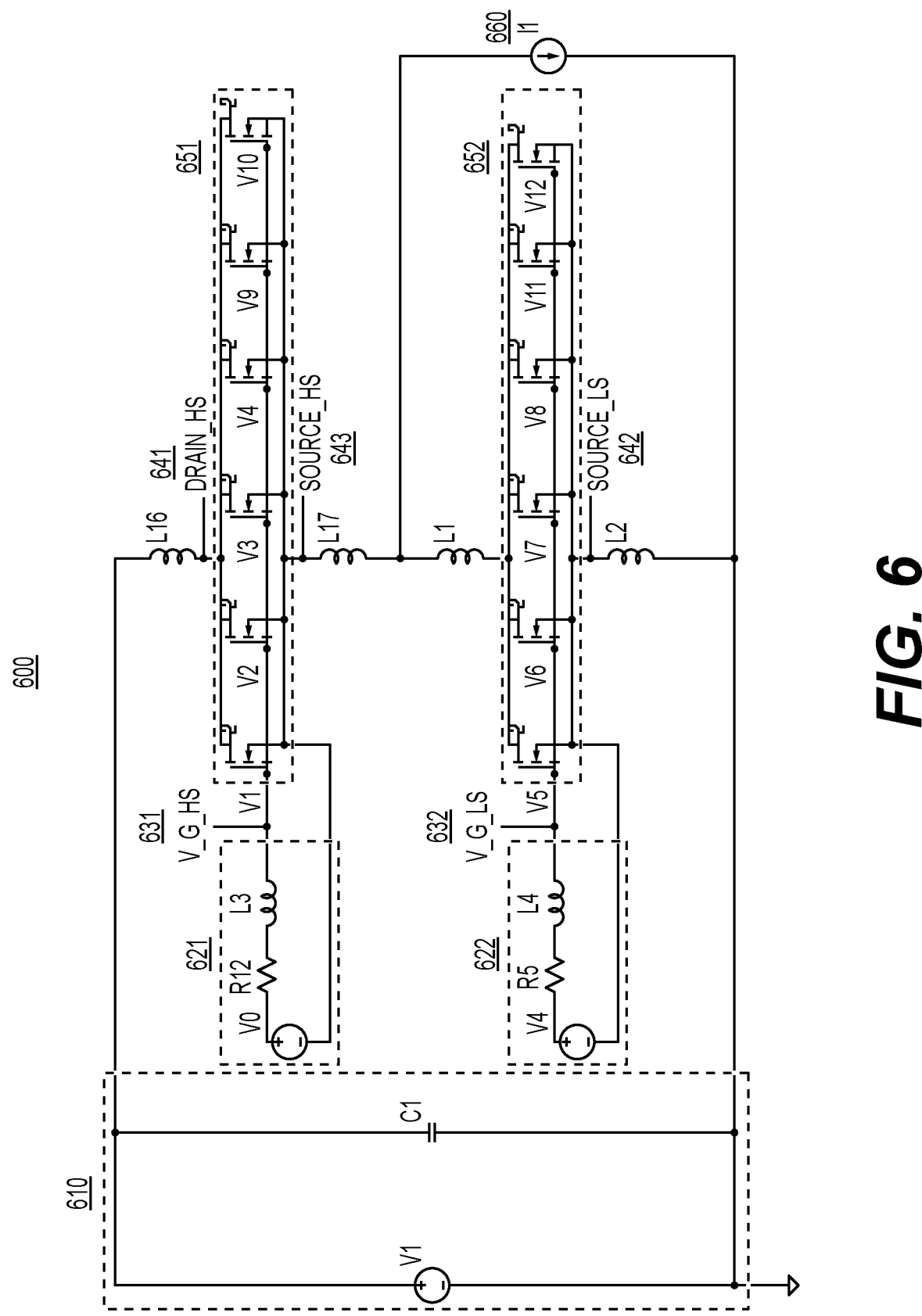
FIG. 6 depicts an electrical schematic of power switch control in a system, according to one or more embodiments.

FIG. 6 depicts an electrical schematic of power switch control in a system, according to one or more embodiments. As shown in FIG. 6, system 600 may include power supply 610, high side gate supply 621, high side gate connection 631, high side drain connection 641, high side source connection 643, high side power switch 651, low side gate supply 622, low side gate connection 632, low side source connection 642, low side power switch 652, and load 660.

High side gate supply 621 may include a voltage supply V0, characteristic resistance R12, and characteristic inductance L3. High side power switch 651 may include parallel switches V1, V2, V3, V4, V9, and V10. Low side gate supply 622 may include a voltage supply V4, characteristic resistance R5, and characteristic inductance L4. Low side power switch 652 may include parallel switches V5, V6, V7, V8, V11, and V12.

Figure 7:
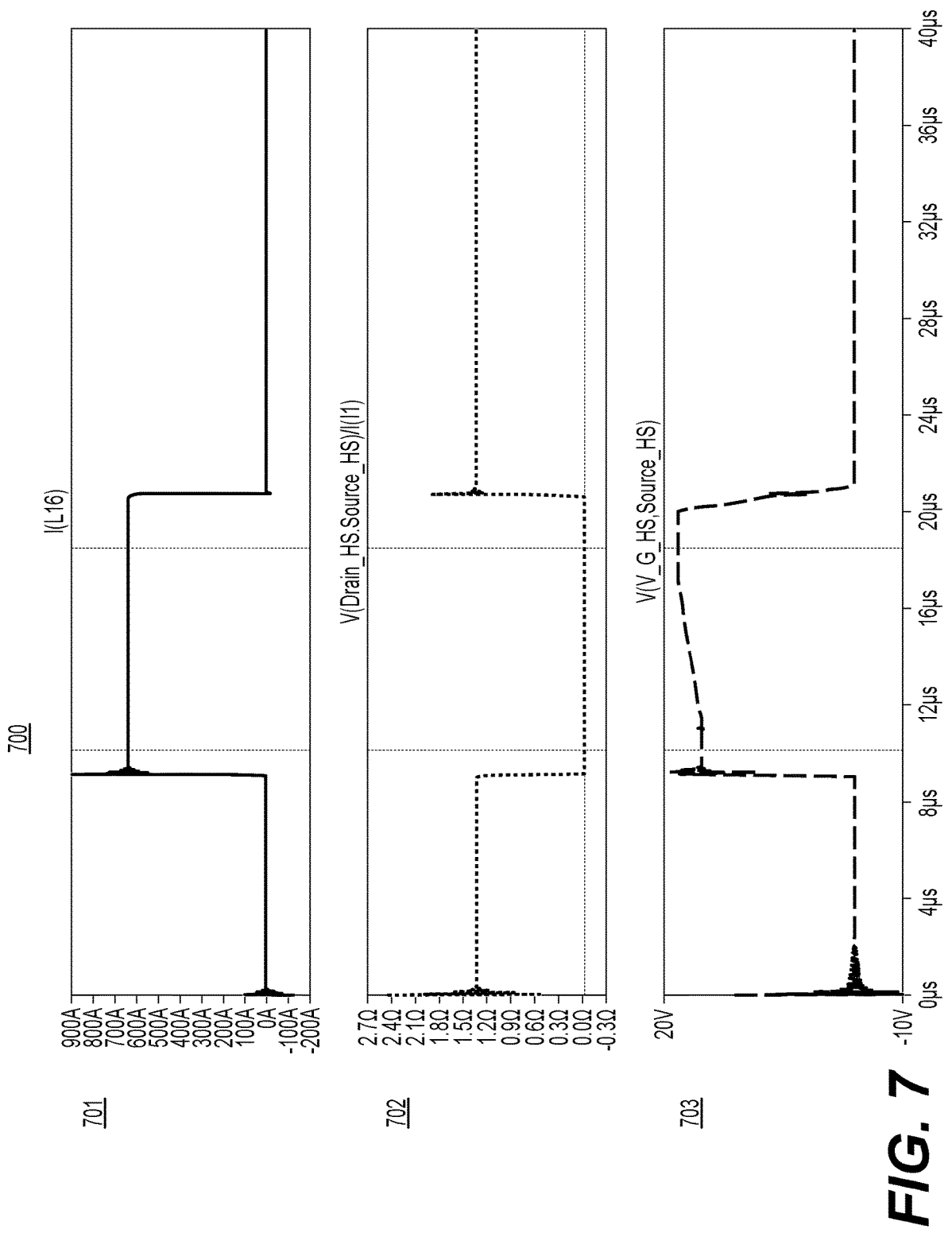
FIG. 7 depicts selected signals of a power switch control system, according to one or more embodiments.

FIG. 7 depicts selected signals 700 of a power switch control system, according to one or more embodiments. As shown in plot 701, a load current (e.g. at L16 in FIG. 6) may follow a generally square wave pulse from approximately 0 A to approximately 600 A based on a corresponding on pulse from a power switch, such as power switch 420, high side power switch 651, or low side power switch 652. As shown in plot 702, a power switch resistance (e.g. on-state resistance Rds-on of high side power switch 651) may follow a generally inverse square wave pulse from approximately 1.35Ω to approximately 0Ω based on a corresponding on pulse from a power switch. As shown in plot 703, a power switch gate-to-source voltage (e.g. of high side power switch 651) may generally follow an output signal waveform.

As shown in plot 703, one or more embodiments may increase a power level of the power switch at a first rate from an off-state power level to a first on-state power level in a first time period from approximately 8.9 µs to approximately 9.1 µs. For example, the power switch may increase from an off-state power level of approximately –4V to a first on-state power level of approximately 18V in less than approximately 1 µs (i.e. a rate of at least 22V/1 µs).

One or more embodiments may increase the power level of the power switch at a second rate to a second on-state power level in a second time period from approximately 10 µs to approximately 18 µs. For example, the power switch may increase from approximately 15 V to a second on-state power level of approximately 18V in a second time period from approximately 10 µs to approximately 18 µs (i.e. a rate of 3V/8 µs). As shown in FIG. 7, the second time period is subsequent to a settling of a ringing phase of the power switch, where the ringing phase is caused by the increase at a first rate from the off-state power level to the first on-state power level in the first time period.

One or more embodiments may decrease the power level of the power switch from the first on-state power level (e.g. approximately 18V) to a third on-state power level (e.g. approximately 15V), lower than the first on-state power level, in a third time period (e.g. approximately 9.1 µs to approximately 10 µs) subsequent to the first time period (e.g. approximately 8.9 µs to approximately 9.1 µs) and preceding the second time period (e.g. approximately 10 µs to approximately 18 µs).

Figure 8:
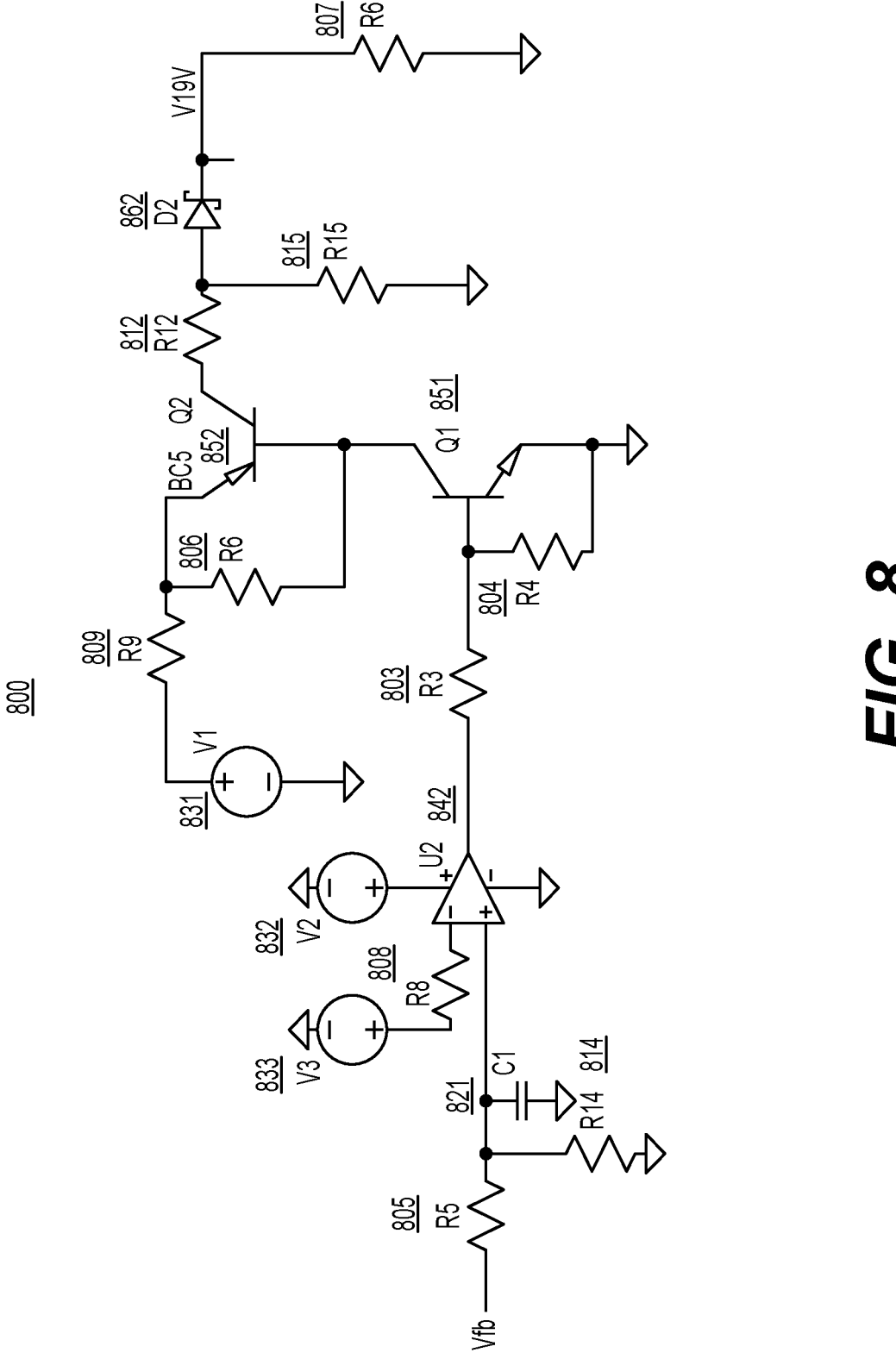
FIG. 8 depicts an electrical schematic of a power switch control system, according to one or more embodiments.

FIG. 8 depicts an electrical schematic of a power switch control system, according to one or more embodiments. Gate driver system 800 may include various electrical hardware components. Gate driver system 800 may include R5 delay resistor 805, R12 ramp resistor 812, R14 delay resistor 814, C1 delay capacitor 821, V3 power supply 833, R8 resistor 808, V2 power supply 832, U2 comparator 842, V1 power supply 831, R9 resistor 809, R6 resistor 806, R3 resistor 803, R4 resistor 804, Q1 switch 851, Q2 switch 852, R12 ramp resistor 812, R15 resistor 815, D2 diode 862, and R7 resistor 807. Gate driver system 800 may function as a waveform controller to adjust a PWM signal. D2 diode 862 may control a flow of current from an external power supply of gate driver system 800. Gate driver system 800 may be an external waveform controller for a gate driver or may be integrated into a gate driver.

R5 delay resistor 805, R14 delay resistor 814, and C1 delay capacitor 821 may control a time delay between an initial rise in the on signal (e.g. first on-state power level 510) and a subsequent rise (e.g. second on-state power level 515) in the on signal. For example, increasing a resistance value of R5 delay resistor 805 may increase a time delay of subsequent rise (e.g. second on-state power level 515). A resistance value of R12 ramp resistor 812 may control a shape of a waveform of the subsequent ramp (e.g. second on-state power level 515) in the on signal. For example, increasing a resistance value of R12 ramp resistor 812 may flatten the waveform of the subsequent ramp (e.g. second on-state power level 515) in the on signal.

Figure 9:
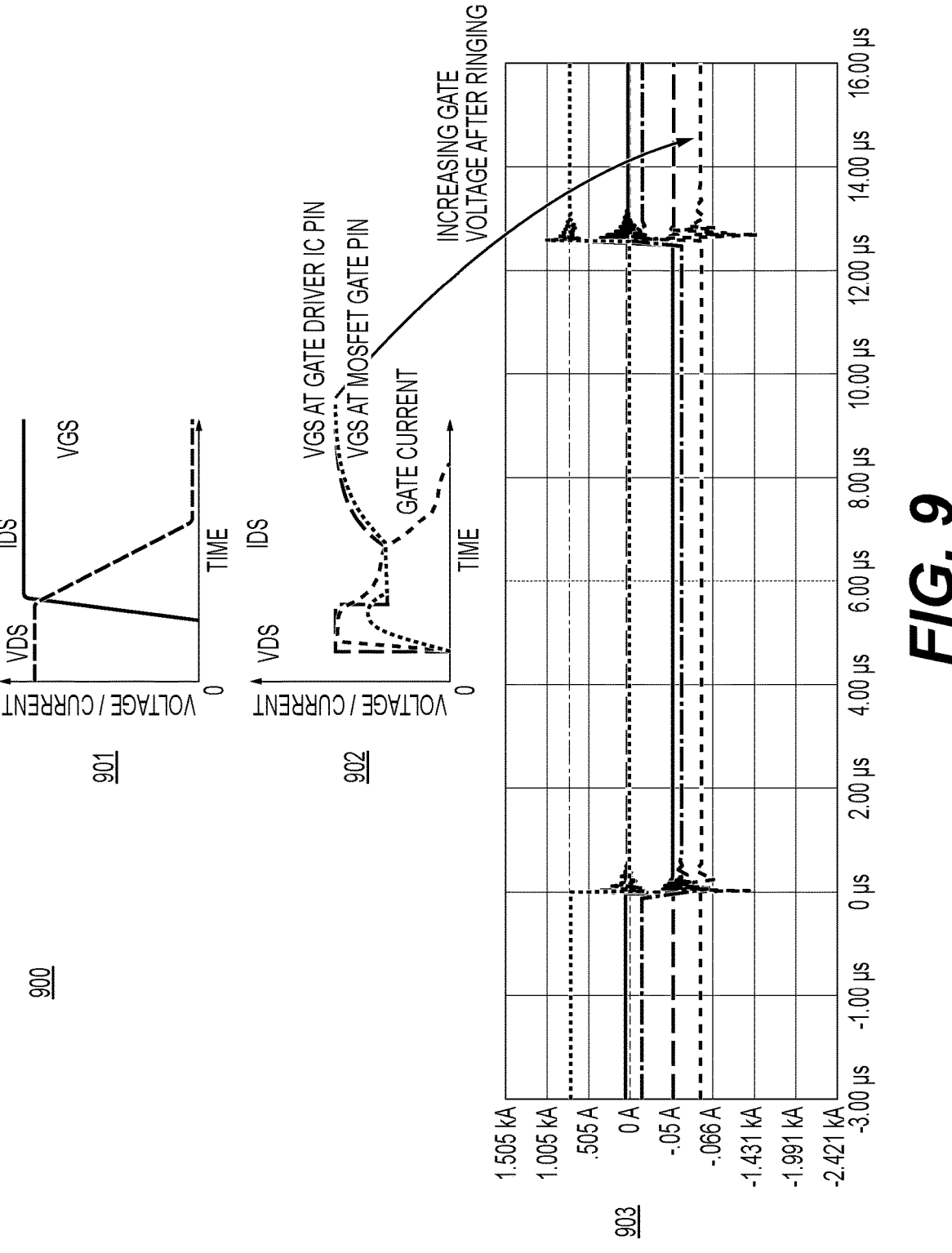
FIG. 9 depicts selected signals of a power switch control system, according to one or more embodiments.

FIG. 9 depicts selected signals 900 of a power switch control system, according to one or more embodiments. As shown in plot 901, a gate-to-source voltage of a switch controls a drain-to-source voltage and a drain-to-source current, so that as the switch turns on, the drain-to-source voltage decreases and a drain-to-source current increases. As shown in plots 902 and 903, a gate-to-source voltage may be quickly increased, which may result in a ringing phase. The gate-to-source voltage may be subsequently decreased to avoid exceeding a rated gate voltage during the ringing phase. A voltage level at the output of gate driver may be higher than a MOSFET gate voltage capability. Accordingly, a gate voltage may be reduced due to a static gate voltage limit and to avoid exceeding the limit during ringing. The gate-to-source voltage may be subsequently increased without excessive ringing.

One or more embodiments may decrease a switching loss of the power switch with a first high Vgs. One or more embodiments may avoid exceeding a rated gate voltage during a ringing phase of the power switch with a second lower Vgs. A voltage level at the output of gate driver may be higher than a MOSFET gate voltage capability. Accordingly, a gate voltage may be reduced due to a static gate voltage limit and to avoid exceeding the limit during ringing. One or more embodiments may decrease a conduction loss of the power switch with a third higher Vgs. One or more embodiments may limit dynamics, such as additional ringing of the power switch, during the transition from the second lower Vgs to the third higher Vgs with a ramped Vgs.

One or more embodiments may provide a fast turn-on power switch without an increase in ringing. One or more embodiments may provide a reduced on-state resistance, reduced conduction loss, and reduced junction temperature. One or more embodiments may provide a reduced substrate size and reduction in a cost and overall size of the power module, due to the reduced junction temperature.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
   a power switch including a gate terminal; and
   a gate driver configured to:
      receive a pulse to control an operation of the power switch,
      generate, based on the received pulse, a first signal to the gate terminal to increase a gate voltage level of the power switch at a first rate from an off-state gate voltage level to a first on-state gate voltage level in a first time period, and
      generate, based on the received pulse, a second signal to the gate terminal to increase the gate voltage level of the power switch at a second rate, less than the first rate, to a second on-state gate voltage level in a second time period subsequent to the first time period, wherein the second time period is subsequent to a settling of a ringing phase at the gate terminal of the power switch, wherein the ringing phase is caused by the generated first signal.

2. The system of claim 1, wherein the first rate is configured to cause the power switch to transition from the off-state gate voltage level to the first on-state gate voltage level in less than 1 μs.

3. The system of claim 1, wherein the second rate is configured to cause the power switch to increase to the second on-state gate voltage level with reduced oscillations relative to oscillations of the gate voltage level of the power switch in the first time period.

4. The system of claim 1, wherein the gate driver is further configured to:
   generate, based on the received pulse, a third signal to the gate terminal to decrease the gate voltage level of the power switch from the first on-state gate voltage level to a third on-state gate voltage level, lower than the first on-state gate voltage level, in a third time period subsequent to the first time period and preceding the second time period.

5. The system of claim 4, wherein the second signal is configured to increase the gate voltage level of the power switch from the third on-state gate voltage level to the second on-state gate voltage level.

6. The system of claim 4, wherein the third signal is configured to cause the power switch to decrease to the third on-state gate voltage level to avoid an overshoot of the gate voltage level of the power switch above a maximum rated gate voltage level of the power switch.

7. The system of claim 1, wherein the gate driver is further configured to:
   generate, based on the received pulse, a fourth signal to the gate terminal to decrease the gate voltage level of the power switch from the second on-state gate voltage level to the off-state gate voltage level in a fourth time period subsequent to the second time period.

8. The system of claim 1, further comprising:
the battery configured to supply the DC power to the inverter; and
the motor configured to receive the AC power from the inverter to drive the motor.

9. The system of claim 8, further comprising:
an electric vehicle including the battery, the inverter, and the motor.

10. A system comprising:
a power switch driver configured to:
   receive a pulse to control an operation of a power switch,
   generate, based on the received pulse, a first signal to the power switch to increase a gate voltage level of the power switch at a first rate from an off-state gate voltage level to a first on-state gate voltage level in a first time period, and
   generate, based on the received pulse, a second signal to the power switch to increase the gate voltage level of the power switch at a second rate, less than the first rate, to a second on-state gate voltage level in a second time period subsequent to the first time period,
   wherein the power switch driver includes one or more of:
      one or more diodes to control flow of current from an external power supply, or
      one or more resistors to control the first rate and the second rate.

11. The system of claim 10, wherein:
the first rate is at least 22V/1 μs, and
the second rate is approximately 3V/8 μs.

12. The system of claim 10, wherein the power switch driver is an external waveform controller for a gate driver.

13. The system of claim 10, wherein the power switch driver includes one or more power supplies to generate one or more of the first signal or the second signal.

14. The system of claim 10, wherein the power switch driver includes one or more switches to generate one or more of the first signal or the second signal.

15. A system comprising:

a gate driver configured to receive a pulse to control an operation of a power switch, and generate a gate signal based on the pulse; and a waveform controller configured to:

receive the gate signal from the gate driver, generate, based on the received gate signal, a first signal to the power switch to increase a gate voltage level of the power switch at a first rate from an off-state gate voltage level to a first on-state gate voltage level in a first time period, and generate, based on the received gate signal, a second signal to the power switch to increase the gate voltage level of the power switch at a second rate, less than the first rate, to a second on-state gate voltage level in a second time period subsequent to the first time period, wherein the second rate is configured to cause the power switch to increase to the second on-state gate voltage level with reduced oscillations relative to oscillations of the gate voltage level of the power switch in the first time period.

16. The system of claim 15, wherein the waveform controller includes one or more electrical hardware components to control a time delay between an initial rise in the gate voltage level of the power switch to the first on-state gate voltage level and a subsequent rise in the gate voltage level of the power switch to the second on-state gate voltage level.

17. The system of claim 15, wherein the waveform controller includes one or more electrical hardware components to control the second rate.

\* \* \* \* \*